(12) United States Patent
Milligan et al.

(10) Patent No.: US 9,018,111 B2
(45) Date of Patent: Apr. 28, 2015

(54) SEMICONDUCTOR REACTION CHAMBER WITH PLASMA CAPABILITIES

(71) Applicant: ASM IP Holding B.V., Almere (NL)

(72) Inventors: Robert Brennan Milligan, Gold Canyon, AZ (US); Fred Alokozai, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/948,055

(22) Filed: Jul. 22, 2013

(65) Prior Publication Data

US 2015/0024609 A1    Jan. 22, 2015

(51) Int. Cl.
| | | |
|---|---|---|
| H01L 21/67 | (2006.01) | |
| C23C 16/455 | (2006.01) | |
| H01L 21/3065 | (2006.01) | |
| H01L 21/02 | (2006.01) | |
| H01L 21/314 | (2006.01) | |
| H01J 37/32 | (2006.01) | |

(52) U.S. Cl.
CPC ...... *H01L 21/67069* (2013.01); *H01L 21/3065* (2013.01); *H01L 21/02274* (2013.01); *H01L 21/0262* (2013.01); *H01L 21/3145* (2013.01); *H01L 21/67017* (2013.01); *C23C 16/455* (2013.01); *H01J 37/32082* (2013.01); *H01J 37/32357* (2013.01); *H01J 37/3244* (2013.01)

(58) Field of Classification Search
CPC .................................................. C23C 16/45548
See application file for complete search history.

(56) References Cited

U.S. PATENT DOCUMENTS

| | | | |
|---|---|---|---|
| 2,745,640 | A | 5/1956 | Cushman |
| 2,990,045 | A | 9/1959 | Root |
| 3,833,492 | A | 9/1974 | Bollyky |
| 3,854,443 | A | 12/1974 | Baerg |
| 3,862,397 | A | 1/1975 | Anderson et al. |
| 3,887,790 | A | 6/1975 | Ferguson |
| 4,058,430 | A | 11/1977 | Suntola et al. |
| 4,176,630 | A | 12/1979 | Elmer |
| 4,194,536 | A | 3/1980 | Stine et al. |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

USPTO; Final Office Action dated Jul. 14, 2014 in U.S. Appl. No. 12/754,223.

(Continued)

*Primary Examiner* — Stephen W Smoot
(74) *Attorney, Agent, or Firm* — Snell & Wilmer LLP

(57) ABSTRACT

A processing chamber including a reaction chamber having a processing area, a processing gas inlet in communication with the processing area, a first excited species generation zone in communication with the processing gas inlet and a second exited species generation zone in communication with the processing gas inlet. A method of processing a substrate including the steps of loading a substrate within a processing area, activating a first excited species generation zone to provide a first excited species precursor to the processing area during a first pulse and, activating a second excited species generation zone to provide a second excited species precursor different from the first excited species precursor to the processing area during a second pulse.

22 Claims, 11 Drawing Sheets

(56) References Cited

U.S. PATENT DOCUMENTS

| | | | |
|---|---|---|---|
| 4,389,973 A | 6/1983 | Suntola et al. | |
| 4,393,013 A | 7/1983 | McMenamin | |
| 4,436,674 A | 3/1984 | McMenamin | |
| 4,570,328 A | 2/1986 | Price et al. | |
| 4,653,541 A | 3/1987 | Oehlschlaeger et al. | |
| 4,722,298 A | 2/1988 | Rubin et al. | |
| 4,735,259 A | 4/1988 | Vincent | |
| 4,753,192 A | 6/1988 | Goldsmith et al. | |
| 4,789,294 A | 12/1988 | Sato et al. | |
| 4,821,674 A | 4/1989 | deBoer et al. | |
| 4,827,430 A | 5/1989 | Aid et al. | |
| 4,991,614 A | 2/1991 | Hammel | |
| 5,062,386 A | 11/1991 | Christensen | |
| 5,119,760 A | 6/1992 | McMillan et al. | |
| 5,167,716 A | 12/1992 | Boitnott et al. | |
| 5,199,603 A | 4/1993 | Prescott | |
| 5,221,556 A | 6/1993 | Hawkins et al. | |
| 5,242,539 A | 9/1993 | Kumihashi et al. | |
| 5,243,195 A | 9/1993 | Nishi | |
| 5,326,427 A * | 7/1994 | Jerbic | 438/727 |
| 5,380,367 A | 1/1995 | Bertone | |
| 5,595,606 A | 1/1997 | Fujikawa et al. | |
| 5,632,919 A | 5/1997 | MacCracken et al. | |
| 5,730,801 A | 3/1998 | Tepman | |
| 5,732,744 A | 3/1998 | Barr et al. | |
| 5,736,314 A | 4/1998 | Hayes et al. | |
| 5,796,074 A | 8/1998 | Edelstein et al. | |
| 5,836,483 A | 11/1998 | Disel | |
| 5,855,680 A | 1/1999 | Soininen et al. | |
| 5,979,506 A | 11/1999 | Aarseth | |
| 6,013,553 A | 1/2000 | Wallace | |
| 6,015,465 A | 1/2000 | Kholodenko et al. | |
| 6,060,691 A | 5/2000 | Minami et al. | |
| 6,074,443 A | 6/2000 | Venkatesh | |
| 6,083,321 A | 7/2000 | Lei et al. | |
| 6,086,677 A | 7/2000 | Umotoy et al. | |
| 6,122,036 A | 9/2000 | Yamasaki et al. | |
| 6,125,789 A | 10/2000 | Gupta et al. | |
| 6,129,044 A | 10/2000 | Zhao et al. | |
| 6,148,761 A | 11/2000 | Majewski et al. | |
| 6,161,500 A | 12/2000 | Kopacz et al. | |
| 6,201,999 B1 | 3/2001 | Jevtic | |
| 6,274,878 B1 | 8/2001 | Li et al. | |
| 6,287,965 B1 | 9/2001 | Kang et al. | |
| 6,302,964 B1 | 10/2001 | Umotoy et al. | |
| 6,312,525 B1 | 11/2001 | Bright et al. | |
| 6,326,597 B1 | 12/2001 | Lubomirsky et al. | |
| 6,342,427 B1 | 1/2002 | Choi et al. | |
| 6,367,410 B1 | 4/2002 | Leahey et al. | |
| 6,368,987 B1 | 4/2002 | Kopacz et al. | |
| 6,410,459 B2 | 6/2002 | Blalock et al. | |
| 6,420,279 B1 | 7/2002 | Ono et al. | |
| 6,454,860 B2 | 9/2002 | Metzner et al. | |
| 6,478,872 B1 | 11/2002 | Chae et al. | |
| 6,482,331 B2 | 11/2002 | Lu et al. | |
| 6,483,989 B1 | 11/2002 | Okada et al. | |
| 6,511,539 B1 | 1/2003 | Raaijmakers | |
| 6,534,395 B2 | 3/2003 | Werkhoven et al. | |
| 6,569,239 B2 | 5/2003 | Arai et al. | |
| 6,590,251 B2 | 7/2003 | Kang et al. | |
| 6,594,550 B1 | 7/2003 | Okrah | |
| 6,598,559 B1 | 7/2003 | Vellore et al. | |
| 6,627,503 B2 | 9/2003 | Ma et al. | |
| 6,633,364 B2 | 10/2003 | Hayashi | |
| 6,648,974 B1 | 11/2003 | Ogliari et al. | |
| 6,682,973 B1 | 1/2004 | Paton et al. | |
| 6,709,989 B2 | 3/2004 | Ramdani et al. | |
| 6,710,364 B2 | 3/2004 | Guldi et al. | |
| 6,734,090 B2 | 5/2004 | Agarwala et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,847,014 B1 | 1/2005 | Benjamin et al. | |
| 6,858,547 B2 | 2/2005 | Metzner | |
| 6,863,019 B2 | 3/2005 | Shamouilian | |
| 6,874,480 B1 | 4/2005 | Ismailov | |
| 6,875,677 B1 | 4/2005 | Conley, Jr. et al. | |
| 6,884,066 B2 | 4/2005 | Nguyen et al. | |
| 6,889,864 B2 | 5/2005 | Lindfors et al. | |
| 6,909,839 B2 | 6/2005 | Wang et al. | |
| 6,930,059 B2 | 8/2005 | Conley, Jr. et al. | |
| 6,935,269 B2 | 8/2005 | Lee et al. | |
| 6,955,836 B2 | 10/2005 | Kumagai et al. | |
| 7,045,430 B2 | 5/2006 | Ahn et al. | |
| 7,053,009 B2 | 5/2006 | Conley, Jr. et al. | |
| 7,071,051 B1 | 7/2006 | Jeon et al. | |
| 7,115,838 B2 | 10/2006 | Kurara et al. | |
| 7,122,085 B2 | 10/2006 | Shero et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,147,766 B2 | 12/2006 | Uzoh et al. | |
| 7,172,497 B2 | 2/2007 | Basol et al. | |
| 7,192,824 B2 | 3/2007 | Ahn et al. | |
| 7,192,892 B2 | 3/2007 | Ahn et al. | |
| 7,195,693 B2 | 3/2007 | Cowans | |
| 7,204,887 B2 | 4/2007 | Kawamura et al. | |
| 7,205,247 B2 | 4/2007 | Lee et al. | |
| 7,235,501 B2 | 6/2007 | Ahn et al. | |
| 7,312,494 B2 | 12/2007 | Ahn et al. | |
| 7,329,947 B2 | 2/2008 | Adachi et al. | |
| 7,357,138 B2 | 4/2008 | Ji et al. | |
| 7,393,736 B2 | 7/2008 | Ahn et al. | |
| 7,402,534 B2 | 7/2008 | Mahajani | |
| 7,405,166 B2 | 7/2008 | Liang et al. | |
| 7,405,454 B2 | 7/2008 | Ahn et al. | |
| 7,414,281 B1 | 8/2008 | Fastow | |
| 7,437,060 B2 | 10/2008 | Wang et al. | |
| 7,442,275 B2 | 10/2008 | Cowans | |
| 7,489,389 B2 | 2/2009 | Shibazaki | |
| 7,547,363 B2 | 6/2009 | Tomiyasu et al. | |
| 7,601,223 B2 | 10/2009 | Lindfors et al. | |
| 7,601,225 B2 | 10/2009 | Tuominen et al. | |
| 7,640,142 B2 | 12/2009 | Tachikawa et al. | |
| 7,651,583 B2 | 1/2010 | Kent et al. | |
| D614,153 S | 4/2010 | Fondurulia et al. | |
| 7,720,560 B2 | 5/2010 | Menser et al. | |
| 7,723,648 B2 | 5/2010 | Tsukamoto et al. | |
| 7,740,705 B2 | 6/2010 | Li | |
| 7,780,440 B2 | 8/2010 | Shibagaki et al. | |
| 7,833,353 B2 | 11/2010 | Furukawahara et al. | |
| 7,851,019 B2 | 12/2010 | Tuominen et al. | |
| 7,884,918 B2 | 2/2011 | Hattori | |
| 8,041,197 B2 | 10/2011 | Kasai et al. | |
| 8,055,378 B2 | 11/2011 | Numakura | |
| 8,071,451 B2 | 12/2011 | Uzoh | |
| 8,071,452 B2 | 12/2011 | Raisanen | |
| 8,072,578 B2 | 12/2011 | Yasuda | |
| 8,076,230 B2 | 12/2011 | Wei | |
| 8,076,237 B2 | 12/2011 | Berry | |
| 8,082,946 B2 | 12/2011 | Laverdiere et al. | |
| 8,092,604 B2 | 1/2012 | Tomiyasu et al. | |
| 8,137,462 B2 | 3/2012 | Fondurulia et al. | |
| 8,147,242 B2 | 4/2012 | Shibagaki et al. | |
| 8,216,380 B2 | 7/2012 | White et al. | |
| 8,278,176 B2 | 10/2012 | Bauer et al. | |
| 8,282,769 B2 | 10/2012 | Iizuka | |
| 8,287,648 B2 | 10/2012 | Reed et al. | |
| 8,293,016 B2 | 10/2012 | Bahng et al. | |
| 8,309,173 B2 | 11/2012 | Tuominen et al. | |
| 8,367,528 B2 | 2/2013 | Bauer et al. | |
| 8,444,120 B2 | 5/2013 | Gregg et al. | |
| 8,608,885 B2 | 12/2013 | Goto et al. | |
| 8,683,943 B2 | 4/2014 | Onodera et al. | |
| 8,711,338 B2 | 4/2014 | Liu et al. | |
| 8,726,837 B2 | 5/2014 | Patalay et al. | |
| 8,728,832 B2 | 5/2014 | Raisanen et al. | |
| 8,802,201 B2 | 8/2014 | Raisanen et al. | |
| 8,877,655 B2 | 11/2014 | Shero et al. | |
| 8,883,270 B2 | 11/2014 | Shero et al. | |
| 2002/0001974 A1 | 1/2002 | Chan | |
| 2002/0011210 A1 | 1/2002 | Satoh et al. | |
| 2002/0064592 A1 | 5/2002 | Datta et al. | |
| 2002/0098627 A1 | 7/2002 | Pomarede et al. | |

(56) References Cited

U.S. PATENT DOCUMENTS

| | | |
|---|---|---|
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0023516 A1 | 2/2004 | Londergan et al. |
| 2004/0077182 A1 | 4/2004 | Lim et al. |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054405 A1 | 3/2007 | Jacobs et al. |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0124610 A1 | 5/2010 | Aikawa et al. |
| 2010/0130017 A1 | 5/2010 | Luo et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |

(56) References Cited

U.S. PATENT DOCUMENTS

| | | | |
|---|---|---|---|
| 2011/0308460 A1 | 12/2011 | Hong et al. | |
| 2012/0024479 A1 | 2/2012 | Palagashvili et al. | |
| 2012/0070997 A1 | 3/2012 | Larson | |
| 2012/0090704 A1 | 4/2012 | Laverdiere et al. | |
| 2012/0098107 A1 | 4/2012 | Raisanen et al. | |
| 2012/0114877 A1* | 5/2012 | Lee | 427/569 |
| 2012/0156108 A1 | 6/2012 | Fondurulia et al. | |
| 2012/0160172 A1 | 6/2012 | Wamura et al. | |
| 2012/0240858 A1 | 9/2012 | Taniyama et al. | |
| 2012/0289053 A1* | 11/2012 | Holland et al. | 438/711 |
| 2012/0295427 A1 | 11/2012 | Bauer | |
| 2012/0304935 A1 | 12/2012 | Oosterlaken et al. | |
| 2013/0023129 A1 | 1/2013 | Reed | |
| 2013/0104988 A1 | 5/2013 | Yednak et al. | |
| 2013/0104992 A1 | 5/2013 | Yednak et al. | |
| 2013/0126515 A1 | 5/2013 | Shero et al. | |
| 2013/0129577 A1 | 5/2013 | Halpin et al. | |
| 2013/0230814 A1 | 9/2013 | Dunn et al. | |
| 2013/0264659 A1 | 10/2013 | Jung | |
| 2013/0292676 A1 | 11/2013 | Milligan et al. | |
| 2013/0292807 A1 | 11/2013 | Raisanen et al. | |
| 2014/0000843 A1 | 1/2014 | Dunn et al. | |
| 2014/0014644 A1 | 1/2014 | Akiba et al. | |
| 2014/0027884 A1 | 1/2014 | Tang et al. | |
| 2014/0036274 A1 | 2/2014 | Marquardt et al. | |
| 2014/0060147 A1 | 3/2014 | Sarin et al. | |
| 2014/0067110 A1 | 3/2014 | Lawson et al. | |
| 2014/0073143 A1 | 3/2014 | Alokozai et al. | |
| 2014/0084341 A1 | 3/2014 | Weeks | |
| 2014/0103145 A1 | 4/2014 | White et al. | |
| 2014/0120487 A1 | 5/2014 | Kaneko | |
| 2014/0159170 A1 | 6/2014 | Raisanen et al. | |
| 2014/0175054 A1 | 6/2014 | Carlson et al. | |
| 2014/0217065 A1 | 8/2014 | Winkler et al. | |
| 2014/0220247 A1 | 8/2014 | Haukka et al. | |
| 2014/0251953 A1 | 9/2014 | Winkler et al. | |
| 2014/0251954 A1 | 9/2014 | Winkler et al. | |
| 2014/0346650 A1 | 11/2014 | Raisanen et al. | |
| 2015/0024609 A1 | 1/2015 | Milligan et al. | |
| 2015/0048485 A1 | 2/2015 | Tolle | |

FOREIGN PATENT DOCUMENTS

| | | |
|---|---|---|
| CN | 101522943 | 9/2009 |
| CN | 101423937 | 9/2011 |
| JP | 07283149 | 10/1995 |
| JP | 08335558 | 12/1996 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 1226380 | 1/2005 |
| TW | 200701301 | 1/2007 |
| WO | 2006/056091 | 6/2006 |
| WO | 2006/078666 | 7/2006 |

OTHER PUBLICATIONS

USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.

(56) References Cited

OTHER PUBLICATIONS

USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
USPTO; Restriction Requirement dated May 8, 2014 in U.S. Appl. No. 13/791,246.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in U.S. Appl. No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Notice of Allowance dated Jan. 27, 2015 in U.S. Appl. No. 12/763,037.
USPTO; Final Office Action dated Jan. 16, 2015 in U.S. Appl. No. 13/411,271.
USPTO; Notice of Allowance dated Jan. 20, 2015 in U.S. Appl. No. 13/941,134.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Japanese Patent Office; Office Action dated Dec. 1, 2014 in Application No. 2012-504786.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTal-xN Alloys of Rocksalt Structure. Journal of Applied Physics, 110, pp. 043535-1-043535-6, (2011).
USPTO; Final Office Action dated Jan. 29, 2015 in U.S. Appl. No. 13/283,408.
UPSTO; Notice of Allowance dated Feb. 11, 2015 in U.S. Appl. No. 13/284,642.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Non-Final Office Action dated Feb. 12, 2015 in U.S. Appl. No. 14/457,058.
Chinese Patent Office; Notice on the Third Office Action dated Feb. 9, 2015 in Application No. 201110155056.
Taiwan Patent Office; Office Action dated Dec. 30, 2014 in Application No. 099114330.
Taiwan Patent Office; Office Action dated Dec. 19, 2014 in Application No. 099127063.

\* cited by examiner

SEMICONDUCTOR REACTION CHAMBER WITH PLASMA CAPABILITIES

FIELD OF THE DISCLOSURE

This disclosure relates generally to semiconductor processing, and more particularly to an apparatus and method for providing an excited species of a processing gas to a substrate or wafer in a reaction chamber.

BACKGROUND

Semiconductor fabrication processes are typically conducted with the substrates supported within a chamber under controlled conditions. For many purposes, semiconductor substrates (e.g., wafers) are heated inside the process chamber. For example, substrates can be heated by direct physical contact with an internally heated wafer holder or "chuck." "Susceptors" are wafer supports used in systems where the wafer and susceptors absorb heat.

Some of the important controlled conditions for processing include, but are not limited to, pressure of the chamber, fluid flow rate into the chamber, temperature of the reaction chamber, temperature of the fluid flowing into the reaction chamber, and wafer position on the susceptor during wafer loading.

Heating within the reaction chamber can occur in a number of ways, including lamp banks or arrays positioned above the substrate surface for directly heating the susceptor or susceptor heaters/pedestal heaters positioned below the susceptor. Traditionally, the pedestal style heater extends into the chamber through a bottom wall and the susceptor is mounted on a top surface of the heater. The heater may include a resistive heating element enclosed within the heater to provide conductive heat and increase the susceptor temperature.

Consistent processing and consistent results generally require careful control and metering of processing gases in the system. One of the last resorts for controlling the processing gas is at the showerhead where the processing gas then contacts the wafer in the reaction chamber. Further, obtaining optimal flow rates and uniformity may be difficult at times due to showerhead holes becoming clogged or parasitic precursor reactions occurring within the showerhead.

Plasma based reactors may use direct plasma integral to the reactor or remote plasma positioned upstream of the reactor. Direct plasma can create a more intense and effective plasma but may also damage the substrate. Conversely, remote plasma reduces the risk of damage to the substrate but may suffer from the excited species being less active and therefore not properly reacting with a film on the substrate.

SUMMARY

Various aspects and implementations are disclosed herein that relate to a reaction chamber with plasma capabilities for processing a wafer. In one aspect, a processing chamber includes a reaction chamber having a processing area, a processing gas inlet in communication with the processing area, a first excited species generation zone in communication with the processing gas inlet and a second exited species generation zone in communication with the processing gas inlet.

In one implementation, the first and second excited species generation zones may be in communication with each other. The first and second excited species generation zones may be selectively in communication with each other. A valve may be positioned between the first excited species generation zone and the processing gas inlet. A valve may be positioned between the second excited species generation zone and the processing gas inlet. The first and second excited species generation zones may be non-co-axial.

The first and second excited species generation zones may be co-axially aligned. The first and second excited species generation zones may generate combustibly incompatible excited precursors. The first excited species generation zone may excite a fluorine-based chemistry and the second excited species generation zone may excite a chlorine-based chemistry. The first and second excited species generation zones may each further include an inductively coupled plasma generator. The first and second excited species generation zones inductively coupled plasma generators are each separately controlled. The first and second excited species generation zones may each further include a capacitively coupled plasma generator. The first and second excited species generation zones capacitively coupled plasma generators are each separately controlled.

The processing chamber may further include an inert gas flow positioned between the first and second excited species generation zones. The first and second excited species generation zones may be separated by inert gas valves. The first and second excited species generation zones may be at least partially composed of alumina or quartz. The first and second excited species generation zones may be energized with a single coil.

In another aspect, a method of processing a substrate may include the steps of loading a substrate within a processing area, activating a first excited species generation zone to provide a first excited species precursor to the processing area during a first pulse and, activating a second excited species generation zone to provide a second excited species precursor different from the first excited species precursor to the processing area during a second pulse.

In an implementation, the first and second excited species generation zones are different generation zones.

In another aspect, the method of delivering a plurality of precursors to a processing area may include the steps of providing a first and second excited species generation zones in communication with the processing area, selectively flowing a first precursor through the first excited species generation zone while exciting the first excited species generation zone, and selectively flowing a second precursor through the second excited species generation zone while exciting the second species generation zone.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

Figure 1:
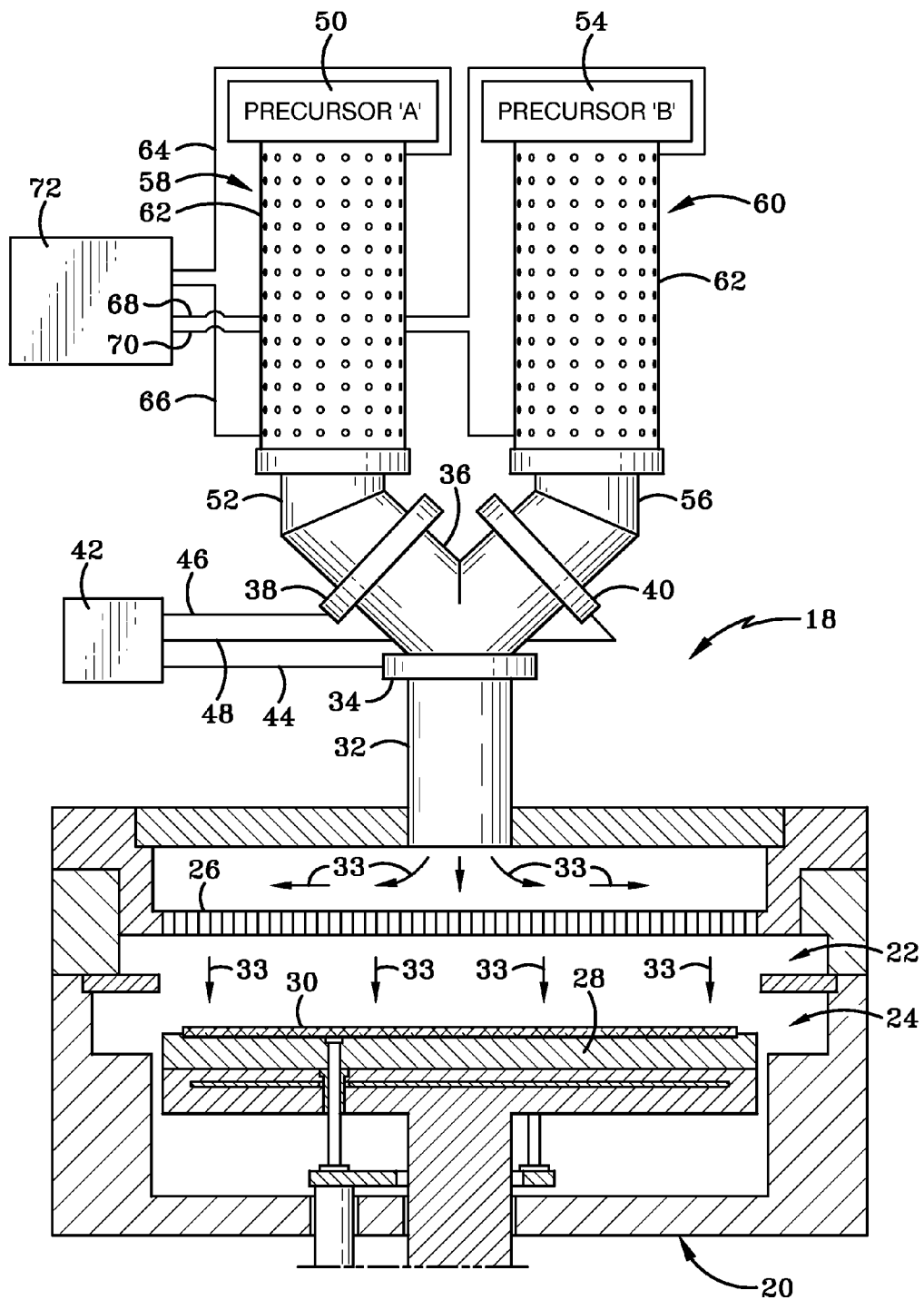
FIG. 1 illustrates a schematic sectional view of a reaction chamber with dual plasma generation regions.

FIG. 1 illustrates a processing chamber 18 with a reaction chamber 20 having an upper chamber 22 and a lower chamber 24. Upper chamber 22 includes a showerhead 26, while lower chamber 24 generally includes a susceptor assembly 28 as may be commonly known in the art to receive wafer 30 for loading, unloading, and processing. While the present disclosure illustrates and describes a showerhead 26 in a split chamber with upper and lower sections, it is within the spirit and scope of the present disclosure to incorporate showerhead 26 in a non-split chamber reactor or a cross-flow reactor without a showerhead. As is also commonly known, showerhead 26 is fed with an inlet manifold 32 (or manifold port injectors or other suitable injecting means in a cross-flow reactor) so that gas flow within the reactor is represented by arrows 33.

Inlet manifold 32 may include a valve 34 which is commonly known in precursor delivery systems and may be a standard pneumatic valve, a mechanical valve, an inert gas valve, or any other suitable valve mechanism. Upstream of valve 34 may be a separation pipe 36 in some implementations with additional valves 38 and 40 similar to valve 34 which function to selectively isolate the various precursor inlets from each other. While not specifically shown, additional purge or vacuum ports and/or lines may be oriented downstream of valves 38 and 40 to assist with purging the separation pipe 36 and inlet manifold 32. Valves 34, 38, and 40 may be separately controlled with a controller 42 via control lines 44, 46, and 48 respectively or any other suitable controlling system.

Precursor A 50 passes through an outlet pipe 52 upstream of valve 38, while Precursor B 54 passes through outlet pipe 56 upstream of valve 40. Precursor A 50 passes through a first excited species generation zone 58 while Precursor B 54 passes through a second excited species generation zone 60. As can be seen proper valves may be used to isolate the first and second excited species generation zones 58 and 60 so that a reaction between the precursors flowing through each of the respective excited species generation zones can be prevented.

Each of first and second excited species generation zones 58 and 60 may include a Faraday shield 62 on an outer periphery of each zone. First excited species generation zone 58 may include control lines 64 and 66, while second excited species generation zone 60 may include control lines 68 and 70 The various control lines 64, 66, 68, and 70 connect to an excited species generation controller 72 as will be described in greater detail below.

Figure 2:
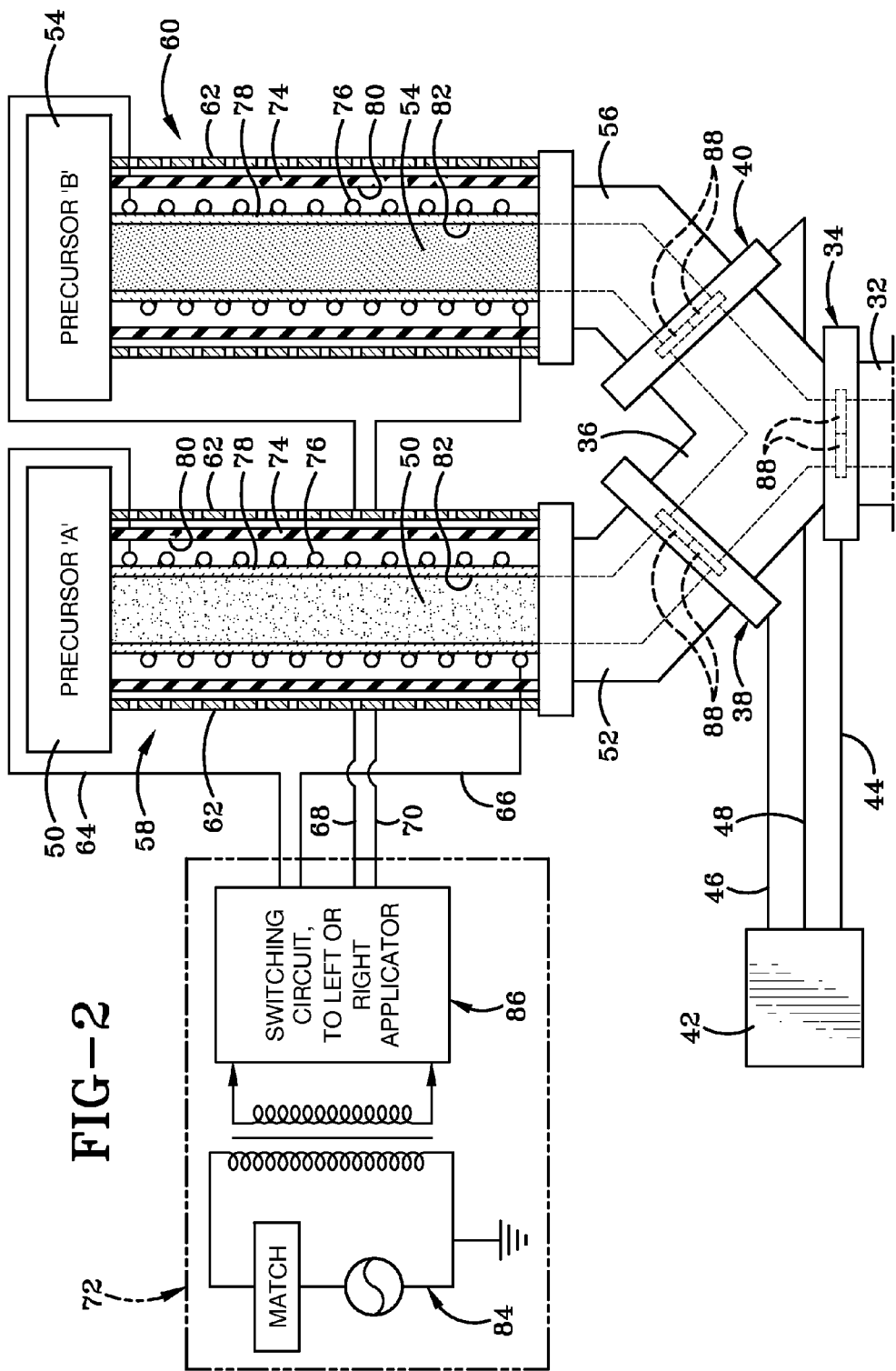
FIG. 2 illustrates a schematic sectional view of the dual plasma generation regions.

FIG. 2 illustrates sectional views of first and second excited species generation zones 58, 60. Both first and second excited species generation zones 58 and 60 include the faraday shield 62, a safety sheath 74, an electrical coil 76, and a generation zone tubing 78. A cooling region 80 is formed between safety sheath 74 and generation zone tubing 78 to provide a cooled inert gas flow to contact and maintain a proper operating temperature of the electrical coil 76 position therein. Generation zone tubing 78 includes an opening 82 therein for receiving Precursor A 50 or Precursor B depending on which excited species generation zone the tubing is positioned in. Advantageously, opening 82 is in fluid communication with appropriate precursor bottles to supply the processing gas and outlet pipe 52 or 56 before passing though gate valves 38 or 40 and ultimately gate valve 34 before reaching the reactor chamber. Generation zone tubing 78 may be composed of any suitable material for the precursors that will be utilized within opening 82. For example, when precursors that incorporate fluorine, oxygen, or hydrogen are utilized the generation zone tubing may be alumina, while when the precursors that incorporate chlorine, oxygen, or silicon chloride are utilized the generation zone tubing may be quartz. The key is that the etch or deposition chemistries are compatible with the generation zone tubing material without unwanted reactions or particle generation. Electrical coil 76 is connected to control lines 64, 66 or 68, 70 (as appropriate) to provide electrical current at the excited species generation zones to form a magnetic field and form an excited species within the appropriate opening 82 for Precursor A 50 or Precursor B 54.

Referring now to controller 72, a powering and matching circuit 84 are shown within controller 72 while a switching circuit 86 may also be incorporated within controller 72 and operated by a processing chamber controller (not shown) in accordance with an appropriate processing recipe or program. Power and matching circuit 84 is designed to provide the proper impedance and power to electrical coils 76 to generate an adequate enough excited species within the appropriate generation zone tubing 78 that the excited species can be moved with an inert gas through the gate valves, the showerhead, and finally the wafer surface. It is also further conceived that each of the first and second exited species generation zones may need different or variable power in which case controller 72 may be regulated to provide this variable current as needed and the power circuit may utilize RF or any other suitable mechanism for power. Referring back to valves 34, 38, and 40, actuators 88 are positioned in each valve and are electrically or pneumatically controlled to open or close depending on the process step being performed. One of skill in the art will immediately appreciate that any suitable mechanism may be incorporated to prevent/permit gas flow through the valves, including actuators 88 or any other device or method known in the art. Preferably, the valves will be capable of high radical conductance to limit and/or prevent the loss of excited species.

Figure 3:
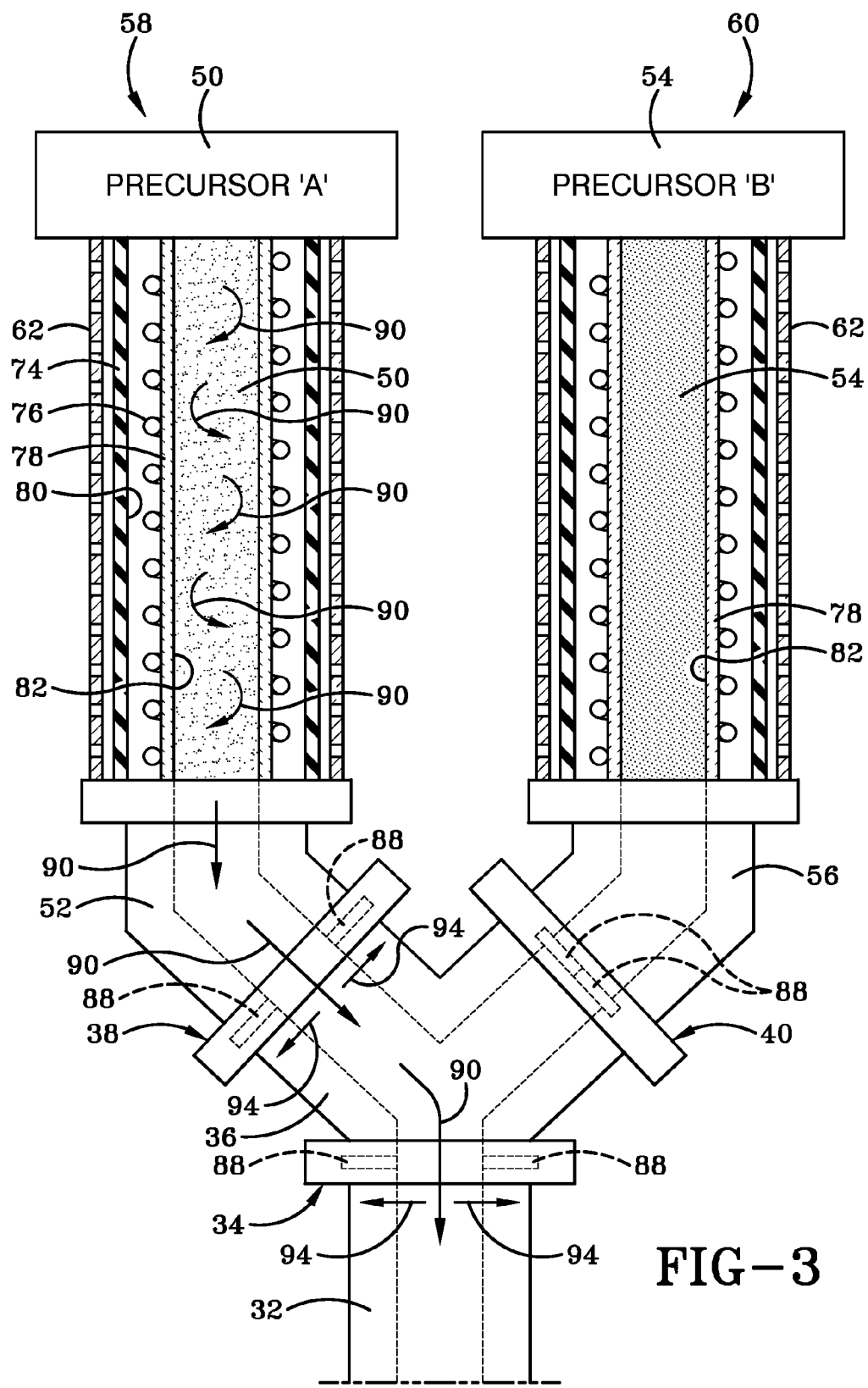
FIG. 3 illustrates a schematic sectional view of the dual plasma generation regions.
Figure 4:
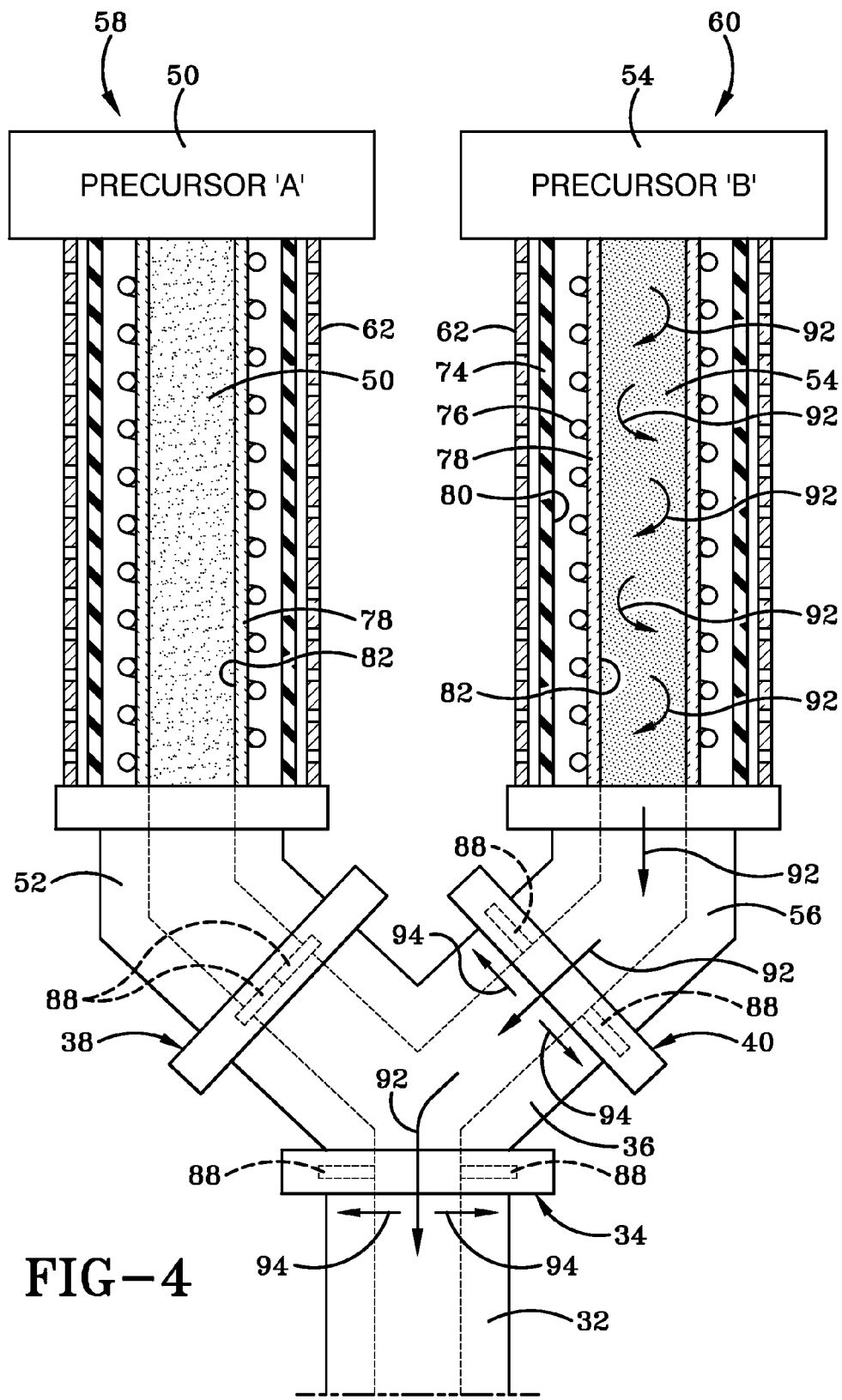
FIG. 4 illustrates a schematic sectional view of the dual plasma generation regions
Figure 5:
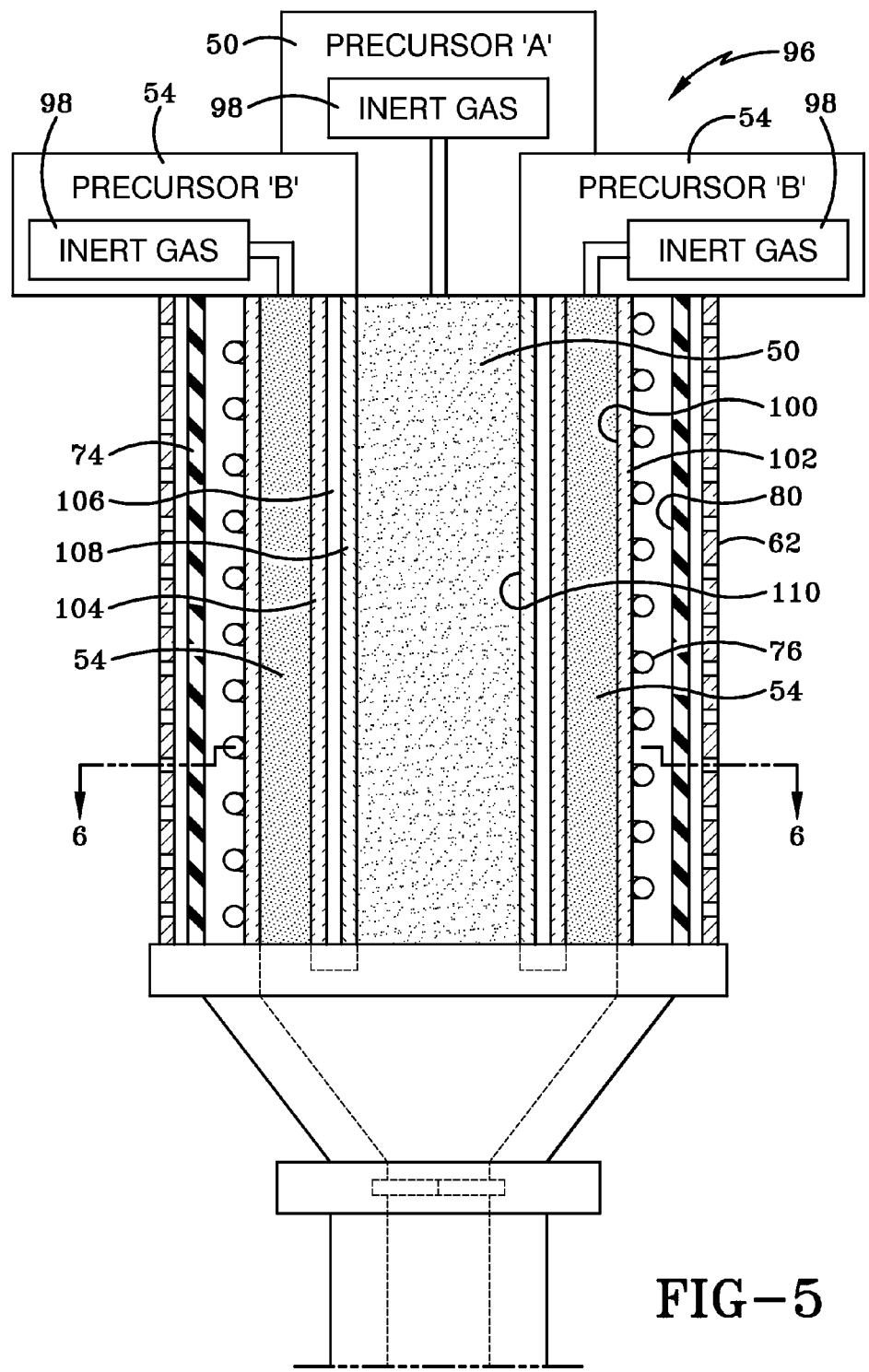
FIG. 5 illustrates a schematic sectional view of a second aspect dual plasma generation regions.
Figure 6:
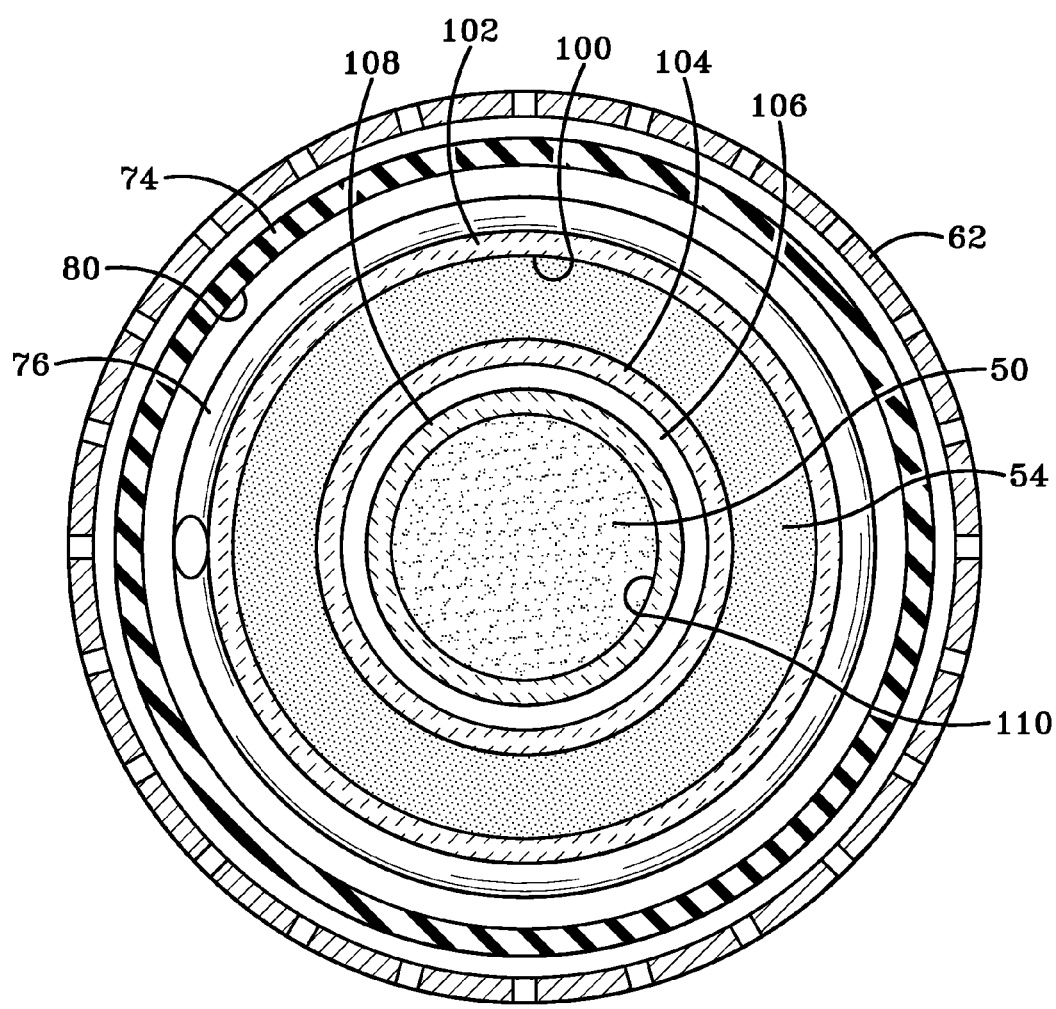
FIG. 6 illustrates a top schematic sectional view of the second aspect dual plasma generation regions taken generally about line 6-6 in FIG. 5.

FIG. 3 illustrates Precursor A 50 being directed through generation zone tubing 78 as indicated by arrows 90, while FIG. 4 illustrates Precursor B 54 being directed through generation zone tubing 78 as indicated by arrows 92. In FIG. 3, when Precursor A 50 is necessary for wafer processing, gate valve 40 remains in the closed position while gate valve 38 and gate valve 34 open in the directions associated with arrows 94 after an appropriate amount of energy has been transferred to the precursor through coil 76. Similarly, when Precursor B 54 is necessary for wafer processing, gate valve 38 remains in the closed position while gate valve 40 and gate valve 34 open in the direction associated with arrows 94 after an appropriate amount of energy has been transferred to the precursor through coil 76.

In operation, the processes shown in FIGS. 3 and 4 are performed separately so that the precursors, whether excited or not, do not meet. In some instances if the precursors were to mix severe damage would result. Further, the excited species generation zones may be separated from one another so that even though both excited species generation zones are being provided with activated species, only one of the activated species, or neither during a chamber purging step, reach the reaction chamber. In another implementation, the switching circuit 86 may be used to selectively activate only one appropriate excited species generation zone at a time to reduce power consumption. Finally, as can be seen in FIG. 4, the first and second excited species generation zones may be offset from one another and non-coaxial in one implementation.

FIGS. 5 through 8 illustrate a second embodiment of first and second excited species generation regions 96 within a single faraday shield 62. In this second implementation, Precursor A 50 and Precursor B 54 are positioned co-axial with each other and share the same excited species generation source or electrical coil 76 and safety sheath 74. Again, similar to the previous implementation, cooling inert gas may flow over electrical coil 76 through cooling region 80. The second implementation 96 may also directly incorporate inert gas flow 98 through both the first and second excited species generation zones to direct the respective excited species precursor to the reaction chamber.

In the disclosed second implementation 96, Precursor B 54 is flowing through an outer region 100 formed by region walls 102 and 104 which may be formed in the shape of a cylinder formed from a material which is complimentary and compatible with the precursor (alumina or quartz by way of non-limiting example). A gap 106 may be positioned radially inward of region wall 104 while region wall 108 forms a central opening 110. Region wall 108 is also preferably formed from a material which is complimentary and compatible with the precursor used therein and may be, by way of non-limiting example, alumina or quartz.

Figure 7:
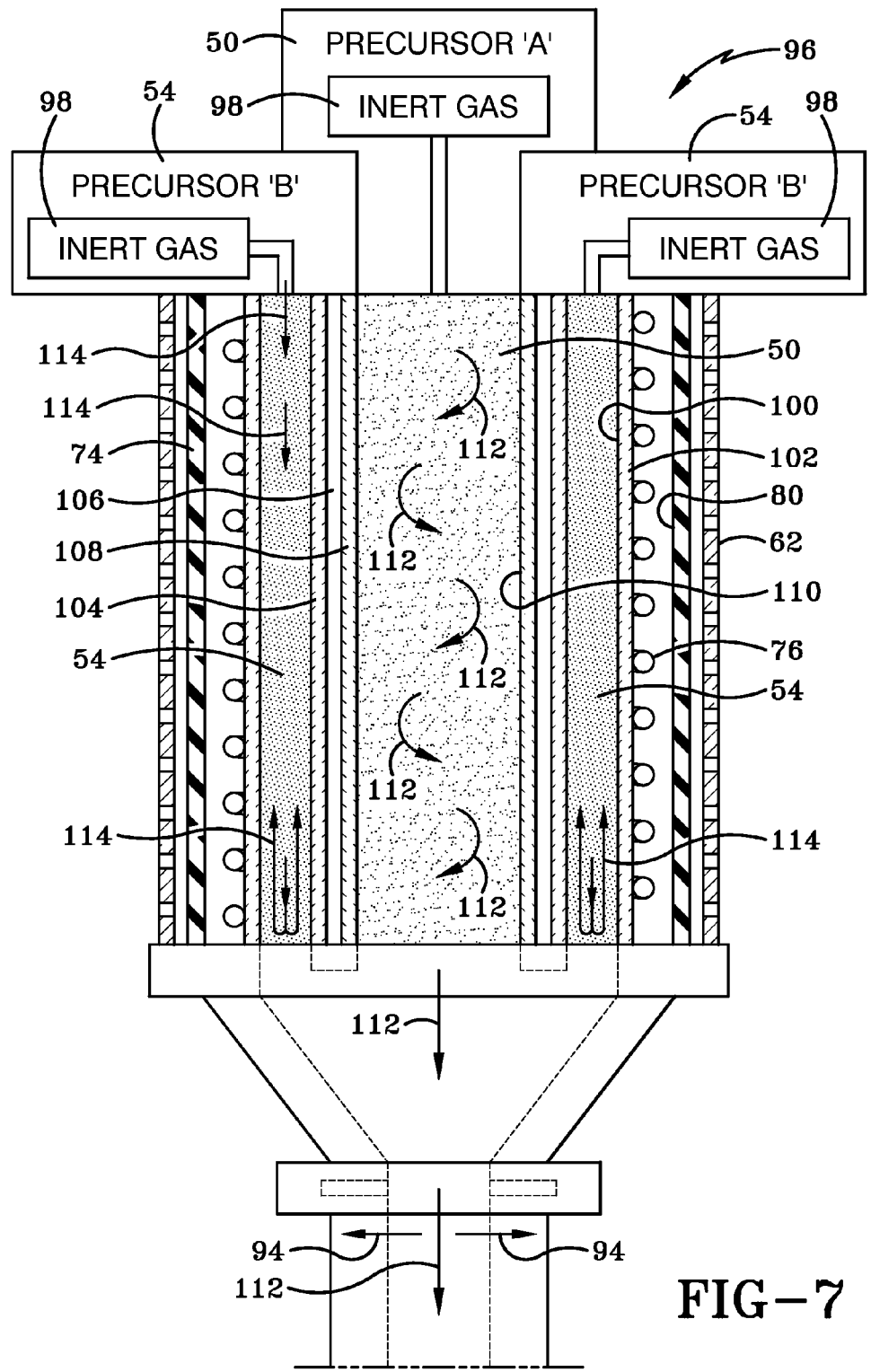
FIG. 7 illustrates a schematic sectional view of the second aspect dual plasma generation regions.

FIG. 7 illustrates Precursor A 50 being activated and moving through central opening 110 as indicated by arrows 112. Precursor A 50 may be moved through the first excited species generation zone with inert gas 98 and may leave the first excited species generation zone because a gate valve is opened to permit communication between the central opening 110 and reaction chamber 20. Arrows 114 indicate the flow path of Precursor B 54 and a gate valve blocking the flow so that Precursor B 54 within the second exited species generation zone cannot leave outer region 100. Thus, a selectively excited precursor can be provided to the reaction chamber on a selective basis with non-compatible precursors.

Figure 8:
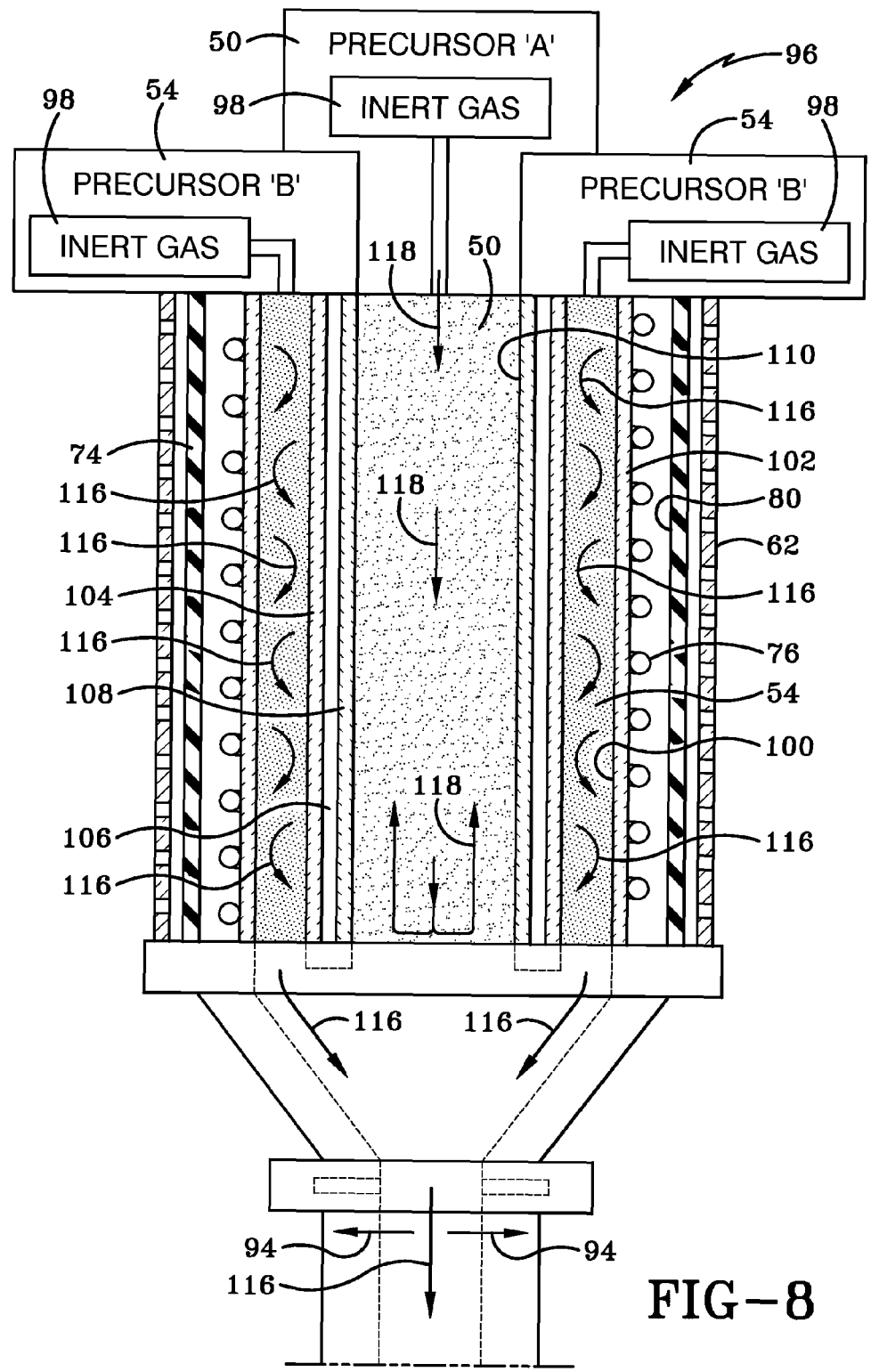
FIG. 8 illustrates a schematic sectional view of the second aspect dual plasma generation regions.

FIG. 8 illustrates Precursor B 54 being activated and moving through outer region 100 as indicated by arrows 116. Precursor B 54 may be moved through the second excited species generation zone with inert gas 98 and may leave the second excited species generation zone because a gate valve is opened to permit communication between the outer region 100 and reaction chamber 20. Arrows 118 indicate the flow path of Precursor A 50 and a gate valve blocking the flow so that Precursor A 50 within the first excited species generation zone cannot leave central opening 110. In operation, Precursor A 50 will be provided to the reaction chamber 20 without Precursor B 54 and then Precursor B 54 will be provided to the reaction chamber 20 without Precursor A 50 in a cyclical process during an etching or deposition process. In this manner, incompatible precursors may be utilized within the reaction chamber without damage or danger.

Figure 9:
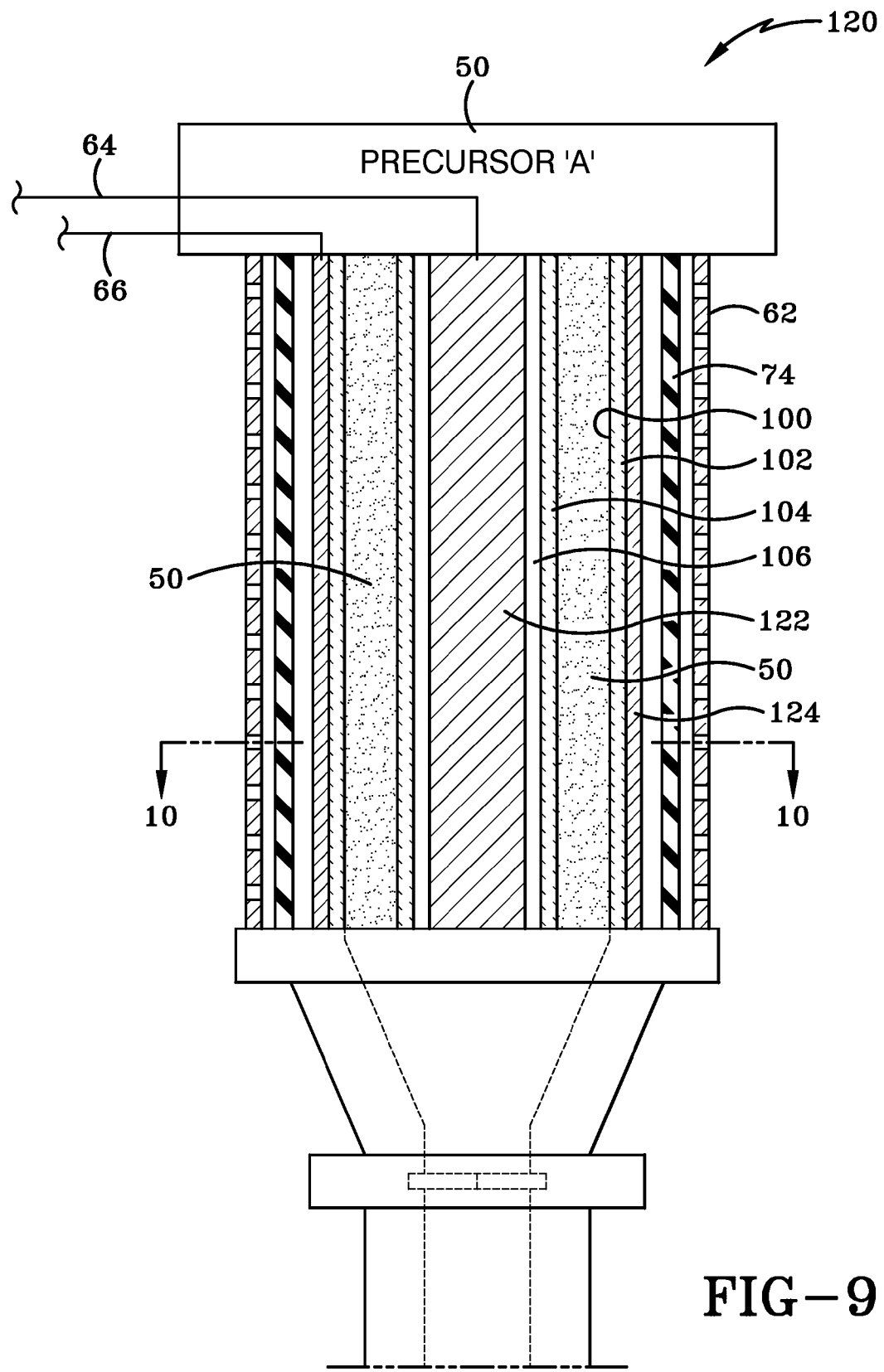
FIG. 9 illustrates a schematic sectional view of a third aspect dual plasma generation regions.
Figure 10:
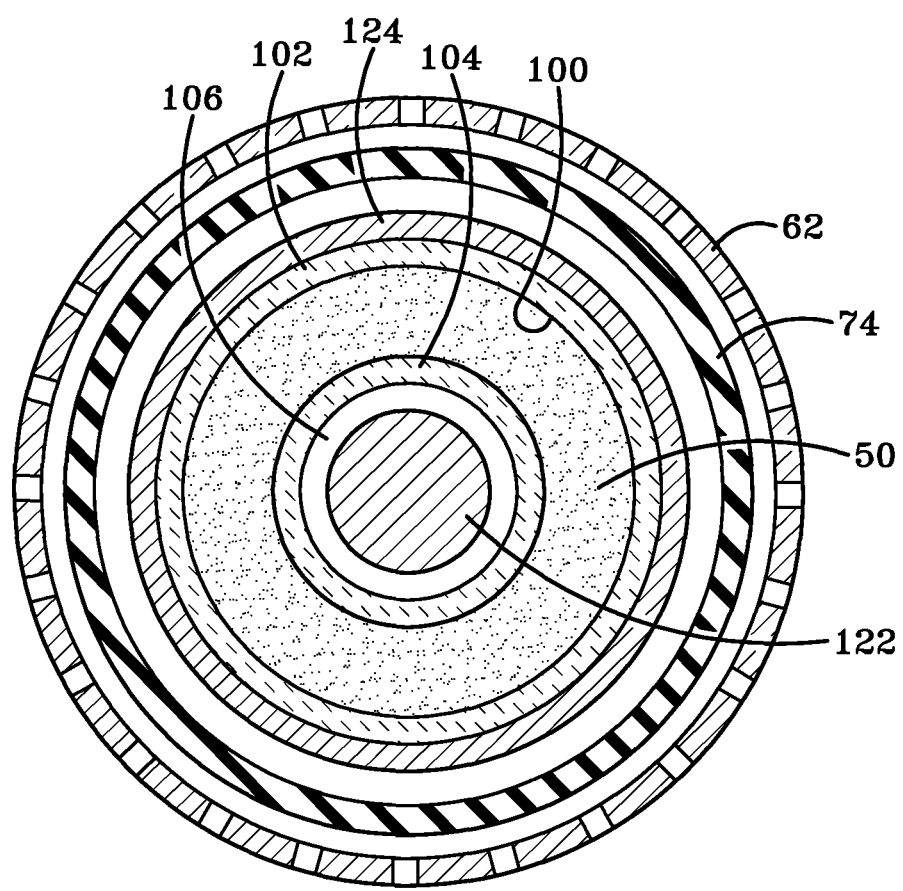
FIG. 10 illustrates a top schematic sectional view of a third aspect dual plasma generation regions.

FIGS. 9 and 10 illustrate views of a third implementation excited species generation zone 120 with a capacitively coupled plasma generator instead of an inductively coupled plasma generator as shown and described above. Once again, region walls 102 and 104 may be cylindrical in shape and define an outer region 100 where Precursor A 50 may be excited and then selectively provided to reaction chamber 20. The plasma generator may include an inner electrode 122 and an outer electrode 124 which are connected to control lines 64 and 66 respectively. In operation, the capacitively coupled plasma inner electrode 122 and outer electrode 124 are activated by controller 72 and may selectively excite Precursor A 50 before flowing the precursor into the reaction chamber 20 for a deposition or etching process. Functionally, the third implementation excited species generation zone 120 is similar to the previously described embodiments with the exception of incorporating a capacitively coupled generator instead of an inductively coupled generator. Further, the third implementation excited species generation zone 120 may utilize non-coaxially arranged generation zones similar to the first aspect and a second excited species generation zone 120 may be positioned in selective communication with the reaction chamber in a similar manner to those previously described without departing from the spirit and scope of the present disclosure.

Figure 11:
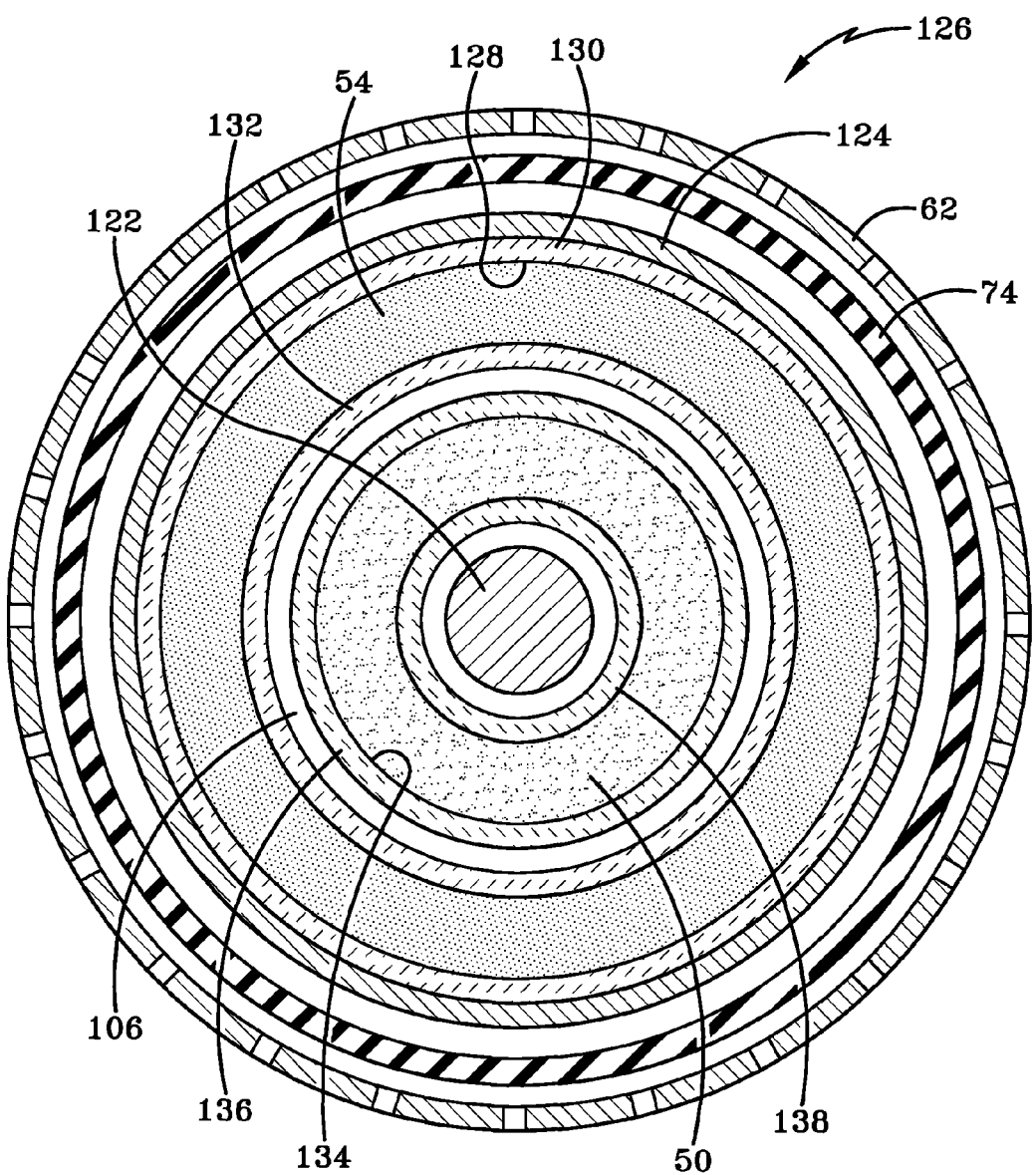
FIG. 11 illustrates an enlarged schematic sectional view of a fourth aspect dual plasma generation regions.

FIG. 11 illustrates a fourth implementation of an excited species generation zone 126 with faraday shield 62 and safety sheath 74. Similar to previous capacitively coupled plasma generators, inner electrode 122 and outer electrode 124 are positioned inside and outside, respectively, of the precursor regions. An outer region 128 is formed by a first wall 130 and a second wall 132 with a precursor flowing between the two walls. An inner region 134 is formed by a third wall 136 and a four wall 138. Walls 130, 132, 136, and 138 may be formed of any suitable material (alumina, quartz, etc.) depending on the precursor in contact with those particular walls. In operation, a single capacitively coupled plasma generator can excite precursor in both inner region 134 and outer region 128 and the flow of those excited species is controlled by gate valves. Alternatively, separate capacitively coupled plasma generators may be utilized for each separate precursor and the flow of excited species of each precursor can be independently controlled through gate valves or based on plasma operation.

In operation, a wafer 30 is loaded on susceptor 28 and a first precursor is activated or excited within one of the first or second excited species generation zones before passing through the necessary gate valves and into the reaction chamber through showerhead 26. At the same time, the second precursor may be retained within the other of the excited species generation zones until the gate valves are opened to permit passage there through. Next, the first precursor flow is stopped with gate valves and the second excited precursor or an inert gas may be provided to the reaction chamber. Since multiple implementations of a plasma generator are shown and described, a single CCP or ICP may be operated continuously to maintain an excited species in both excited species generation zones or separate CCPs and ICPs may be utilized and triggered just before the excited species is needed in the reaction chamber. In this manner, the inlet manifold and reaction chamber can selectively receive excited species of any number of precursors without the precursors coming in contact with each other during processing. Thus it is seen that incompatible excited precursors may be utilized to process a wafer or to etch a reaction chamber by selectively flowing excited species activated in separate plasma generating zones.

These and other embodiments for methods and apparatus for a reaction chamber with dual plasma generation regions therein may incorporate concepts, embodiments, and configurations as described with respect to embodiments of apparatus for measuring devices described above. The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, any connecting lines shown in the various figures are intended to represent exemplary functional relationships and/or physical couplings between the various elements. Many alternative or additional functional relationship or physical connections may be present in the practical system, and/or may be absent in some embodiments. Further, various aspects and implementations of other designs may be incorporated within the scope of the disclosure.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

What is claimed is:

1. A processing chamber comprising:
a reaction chamber having a processing area;
a processing gas inlet in communication with the processing area;
a first excited species generation zone in communication with the processing gas inlet; and,
a second excited species generation zone in communication with the processing gas inlet,
wherein the first and second excited species generation zones are selectively in communication with each other.

2. The processing chamber of claim 1 wherein the first and second excited species generation zones are in communication with each other.

3. The processing chamber of claim 1 wherein a valve is positioned between the first excited species generation zone and the processing gas inlet.

4. The processing chamber of claim 1 wherein a valve is positioned between the second excited species generation zone and the processing gas inlet.

5. The processing chamber of claim 1 wherein the first and second excited species generation zones are non-co-axial.

6. The processing chamber of claim 1 wherein the first and second excited species generation zones are co-axially aligned.

7. The processing chamber of claim 1 wherein the first and second excited species generation zones generate combustibly incompatible precursors.

8. The processing chamber of claim 1 wherein the first excited species generation zone excites a fluorine-based chemistry and the second excited species generation zone excites a chlorine-based chemistry.

9. The processing chamber of claim 1 wherein the first and second excited species generation zones each further comprise an inductively coupled plasma generator.

10. The processing chamber of claim 9 wherein the first and second excited species generation zones inductively coupled plasma generators are each separately controlled.

11. The processing chamber of claim 1 wherein the first and second excited species generation zones each further comprise a capacitively coupled plasma generator.

12. The processing chamber of claim 11 wherein the first and second excited species generation zones capacitively coupled plasma generators are each separately controlled.

13. The processing chamber of claim 1 further comprising an inert gas flow positioned between the first and second excited species generation zones.

14. The processing chamber of claim 1 wherein the first and second excited species generation zones are separated by inert gas valves.

15. The processing chamber of claim 1 wherein the first and second excited species generation zones are at least partially composed of alumina or quartz.

16. The processing chamber of claim 1 wherein the first and second excited species generation zones are energized with a single coil.

17. A processing chamber comprising:
a reaction chamber having a processing area;
a processing gas inlet in communication with the processing area;
a first excited species generation zone in communication with the processing gas inlet; and,
a second excited species generation zone in communication with the processing gas inlet,
wherein the first and second excited species generation zones each further comprise an inductively coupled plasma generator or a capacitively coupled plasma generator,
wherein the first and second excited species generation zones inductively coupled plasma generators are each separately controlled, or
wherein the first and second excited species generation zones capacitively coupled plasma generators are each separately controlled.

18. The processing chamber of claim 17 wherein the first and second excited species generation zones are co-axially aligned.

19. The processing chamber of claim 17 wherein the first and second excited species generation zones are non-coaxial.

20. A processing chamber comprising:
a reaction chamber having a processing area;
a processing gas inlet in communication with the processing area;
a first excited species generation zone in communication with the processing gas inlet; and,
a second excited species generation zone in communication with the processing gas inlet,
wherein the first and second excited species generation zones are co-axially aligned.

21. The processing chamber of claim 20, wherein the first excited species zone and the second excited species zone share an excited species generation source.

22. The processing chamber of claim 20, further comprising an inlet gas flow through the first excited species generation zone and the second excited species generation zone.

* * * * *